United States Patent [19]
Wright

[11] Patent Number: 5,323,082
[45] Date of Patent: Jun. 21, 1994

[54] PIEZOELECTRIC ACTUATOR FOR PLANAR ALIGNMENT

[75] Inventor: David L. Wright, Redwood City, Calif.

[73] Assignee: Spectra Physics Lasers, Inc., Mountain View, Calif.

[21] Appl. No.: 346,798

[22] Filed: May 3, 1989

[51] Int. Cl.⁵ .......................................... H01L 41/08
[52] U.S. Cl. .................................... 310/328; 310/366; 310/369
[58] Field of Search .......................... 310/328, 366, 369

[56] References Cited

U.S. PATENT DOCUMENTS

| | | | |
|---|---|---|---|
| 4,087,715 | 5/1978 | Myer | 310/328 X |
| 4,343,993 | 8/1982 | Binnig et al. | 250/306 |
| 4,675,874 | 6/1987 | Pohler et al. | 372/33 |
| 4,711,573 | 12/1987 | Wijutjes et al. | 356/346 |
| 4,785,177 | 11/1988 | Besocke | 310/328 X |

FOREIGN PATENT DOCUMENTS 0244205 10/1988 Japan ................................... 310/328

OTHER PUBLICATIONS

Piezoelectric Actuator Designs Catalogue, Burleigh Instruments, Inc., Fishers, New York, pp. 9-10.
"Single-tube Three-dimensional Scanner for Scanning Tunnelling Microscopy", Rev. Sci. Instrum. 57(8), Aug. 1986, Binnig et al.

*Primary Examiner*—Mark O. Budd
*Attorney, Agent, or Firm*—Mark A. Haynes

[57] ABSTRACT

An actuator for controlling alignment of an object that is characterized by an alignment plane, such as mirrors used in optical cavities, comprises a mounting frame, and a one piece alignment member formed of piezoelectric material having a first end and a second end that is secured to the mounting frame at the second end. On the first end, a first object contact, a second object contact, and a third object contact are secured defining an object plane. A means is provided for holding the object in contact with the first, second and third object contacts so that the alignment plane of the object has a predetermined relationship with the object plane defined by the object contacts on the tubular member. Electrodes are formed on the tubular member for establishing an electrical field between the surfaces of the alignment member so that the positions of the first object contact, second object contact and third object contact are controlled. By controlling the positions of the object contacts on the first end of the tubular member, precise tilting and translation of the alignment plane of the object is accomplished.

41 Claims, 4 Drawing Sheets

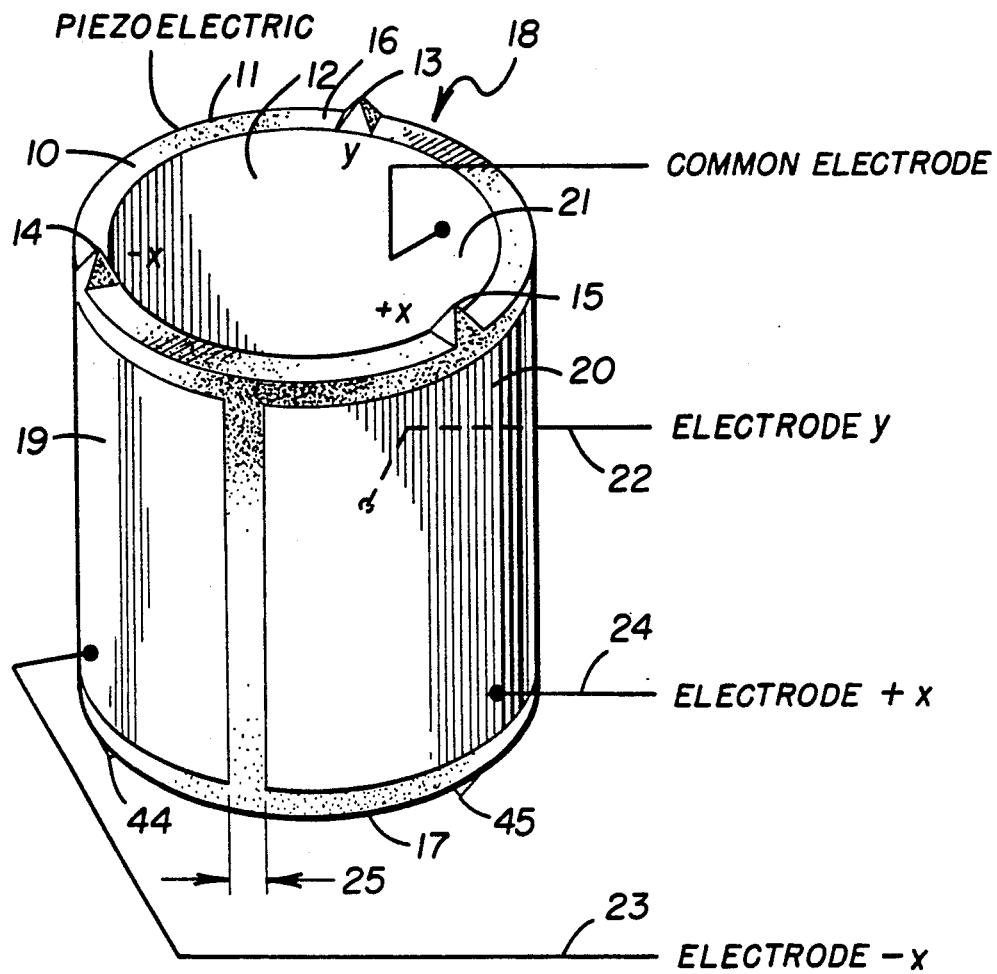
FIGURE 1
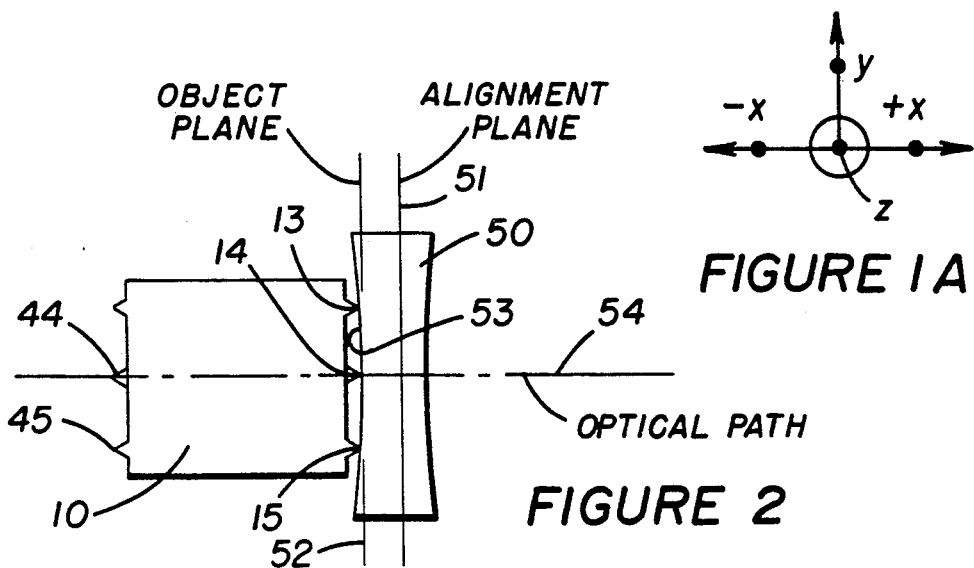
FIGURE 1A
FIGURE 2

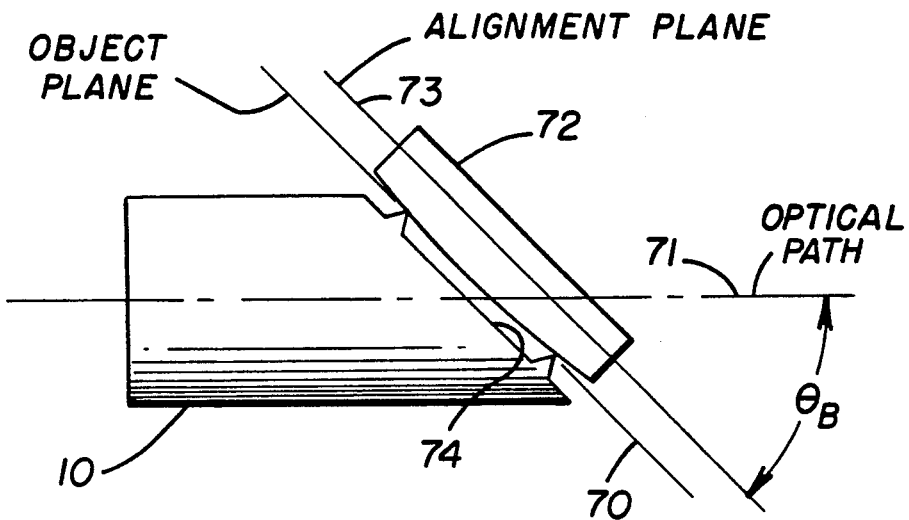
FIGURE 3
FIGURE 7
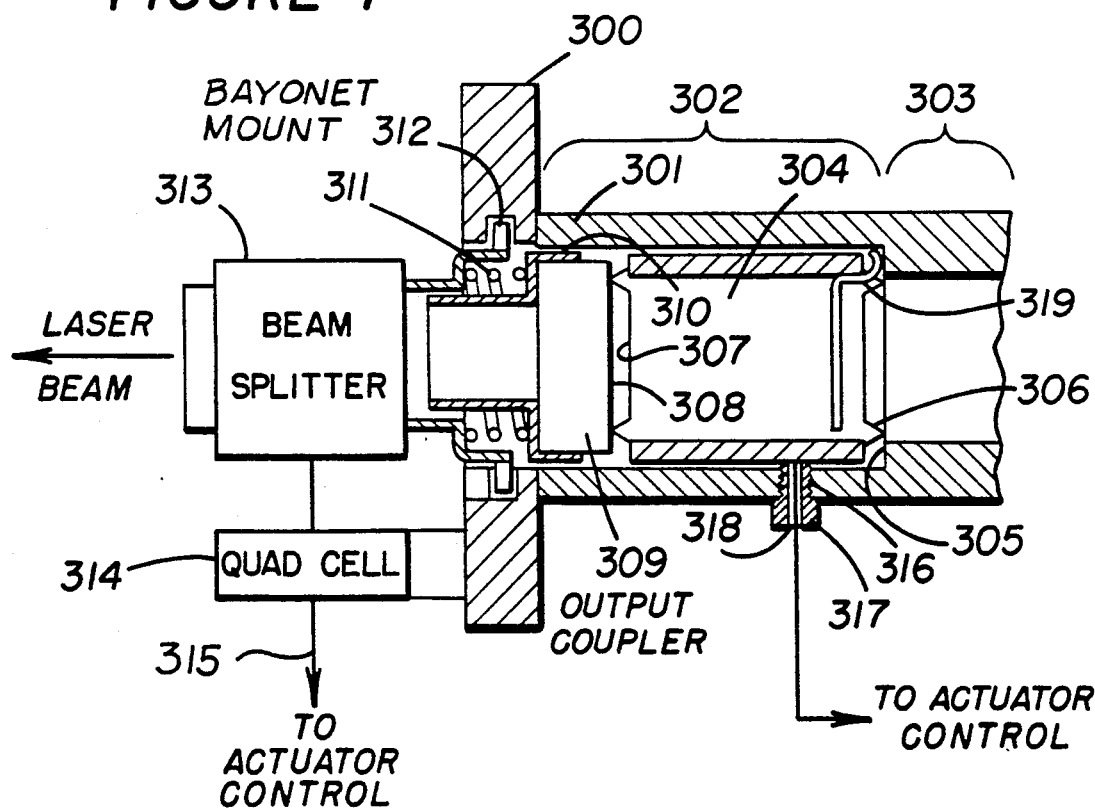

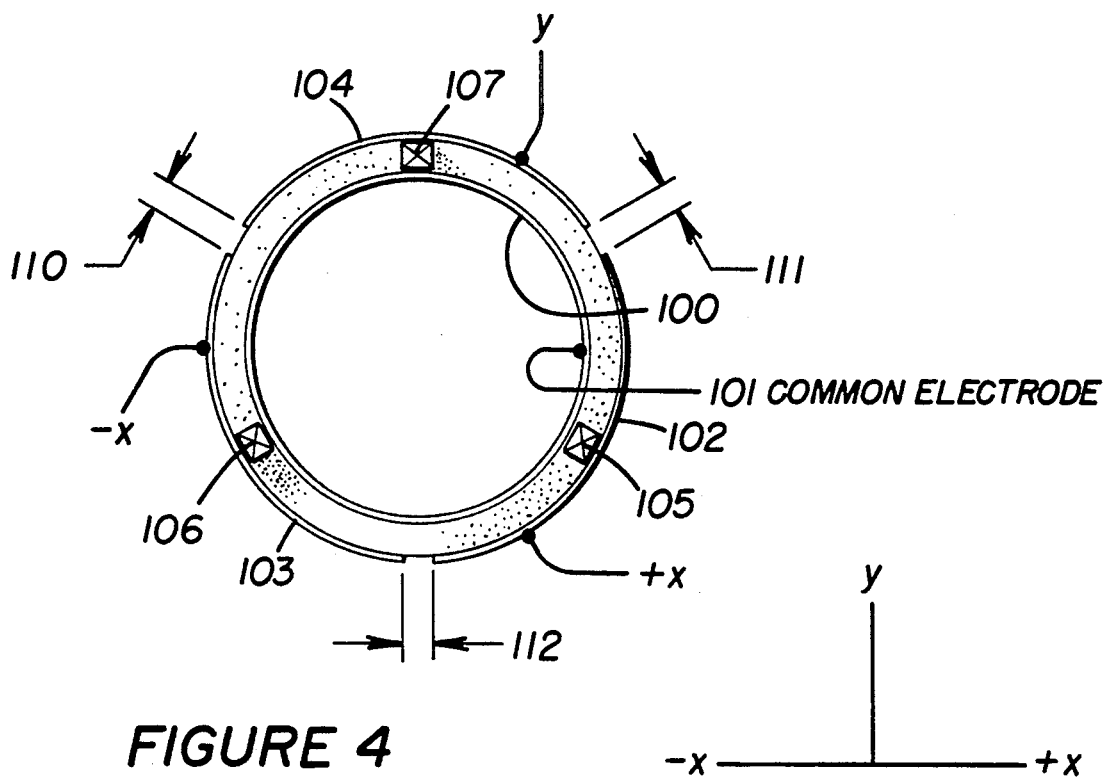
FIGURE 4
FIGURE 4A
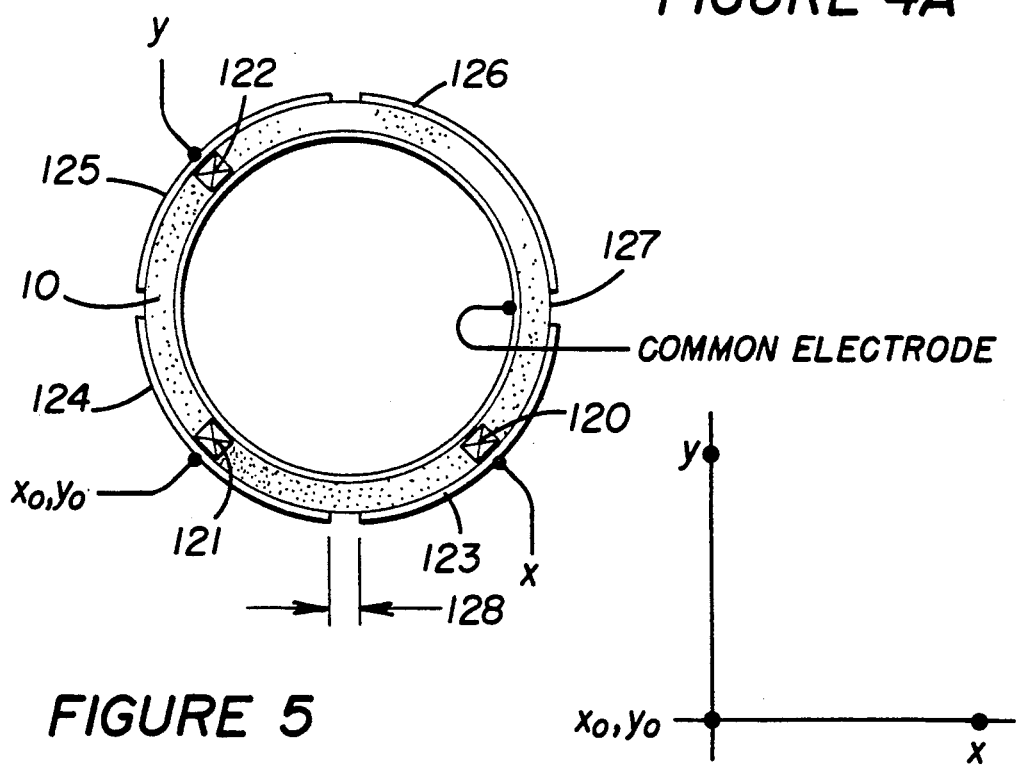
FIGURE 5
FIGURE 5A

PIEZOELECTRIC ACTUATOR FOR PLANAR ALIGNMENT

FIELD OF THE INVENTION

The present invention relates to apparatus for precise alignment of objects characterized by an alignment plane; and more particularly to actuators for precise tilting and translation of mirrors or other optical devices in laser related systems.

DESCRIPTION OF RELATED ART

The stability of the resonant mode in a laser is often limited by thermal expansion and contraction of components in a laser cavity. The thermal drift in the cavity length causes a corresponding drift in the frequency of the axial mode. Thermal tilting of components also degrades beam pointing, transverse mode performance, and power output. Other environmental and operational factors such as vibration contribute to difficulty in setting and maintaining the alignment of mirrors or other optical objects within the laser cavity.

Prior art systems for alignment of optical components of this type include three leg thermal/electric systems typified by Pohler et al., U.S. Pat. No. 4,675,874; issued Jun. 23, 1987. The Pohler et al. system involves individually controlling flow of a heating medium through legs of a mirror mount. The heating medium controls the amount of thermal expansion or contraction of each leg, and therefore provides for planar alignment of a mirror mounted on the legs. Obviously, this system is a complicated mechanism difficult to manufacture. Also, flowing heating media create contamination problems through leaky joints and the like that are undesirable and may create vibrations via turbulent flow.

Burleigh Instruments, Inc., Fishers, N.Y., manufactures a three segment piezoelectric structure for use in precise tilting and translation of mirrors in laser cavities in other optical systems, known as Burleigh PZT Aligner Translators. The three segment design for the Burleigh aligner translator is difficult to manufacture in that it involves a number of small parts that must be glued or otherwise bound together to form the final assembly. The glue is an undesirable element since its vapors can contaminate laser optics, and its high expansion coefficient can contribute to unstable behavior unless very carefully controlled.

In "Single-tube Three-dimensional Scanner for Scanning Tunnelling Microscopy", REV.SCI.INSTRUM. 57(8), August 1986, Binnig et al. report development of a three-axis scanner from a single piezoelectric tube for positioning the scanning tip of a scanning tunnelling microscope. The Binnig et al. scanner is not suitable for use as an aligner for a planar object such as a mirror or lens in a laser system, because it is a 4 element piezo actuator suitable for positioning a scanning tunnelling microscopy probe tip at a single point on a flexible mount glued to 4 points of the scanner.

It is desirable to have an actuator that is clean and simple to manufacture for precise tilting and translation of a device characterized by an alignment plane, such as a mirror, which may be removed and replaced, or interchanged with others, without loss of alignment.

SUMMARY OF THE INVENTION

The present invention is an apparatus for controlling alignment of an object that is characterized by an alignment plane, such as the mirror used in optical cavities.

The apparatus comprises a mounting frame, and an alignment member formed of piezoelectric material having a first end and a second end. The alignment member is secured to the mounting frame at the second end. On the first end, three raised object contacts are formed or secured. The three object contacts define an object plane. A means is provided for holding the object in contact with the object contacts so that the alignment plane of the object has a positively determined relationship with the object plane defined by the three object contacts on the alignment member. Electrodes are formed on the alignment member for establishing an electrical field inside the alignment member, so that the positions of the first, second and third object contacts are separately controlled relative to the second end of the alignment member. By separately controlling the positions of the object contacts on the first end of the alignment member, precisely defined axes of tilting and translation of the alignment plane of the object are accomplished.

Further aspects and advantages of the present invention can be seen from review of the figures, the detailed description and the claims.

BRIEF DESCRIPTION OF THE FIGURES

FIG. 1 is a perspective view of a one piece piezoelectric actuator according to the present invention.

FIG. 1A illustrates alignment axes for the embodiment of FIG. 1.

FIG. 2 is a schematic diagram of the actuator according to the present invention and the object being aligned by the actuator.

FIG. 3 is a schematic diagram illustrating the relationship of the object contacts and an object being aligned by the actuator according to an alternative embodiment of the present invention.

FIG. 4 is a diagram illustrating placement of the object contacts and electrodes on the tubular member.

FIG. 4A illustrates alignment axes for the embodiment of FIG. 4.

FIG. 5 is a diagram of an alternative embodiment for placement of the object contacts and electrodes on the tubular member.

FIG. 5A illustrates alignment axes for the embodiment of FIG. 5.

FIG. 7 is a diagram of the mounting frame for the actuator according to a preferred embodiment of the present invention.

DETAILED DESCRIPTION

Figure 6:
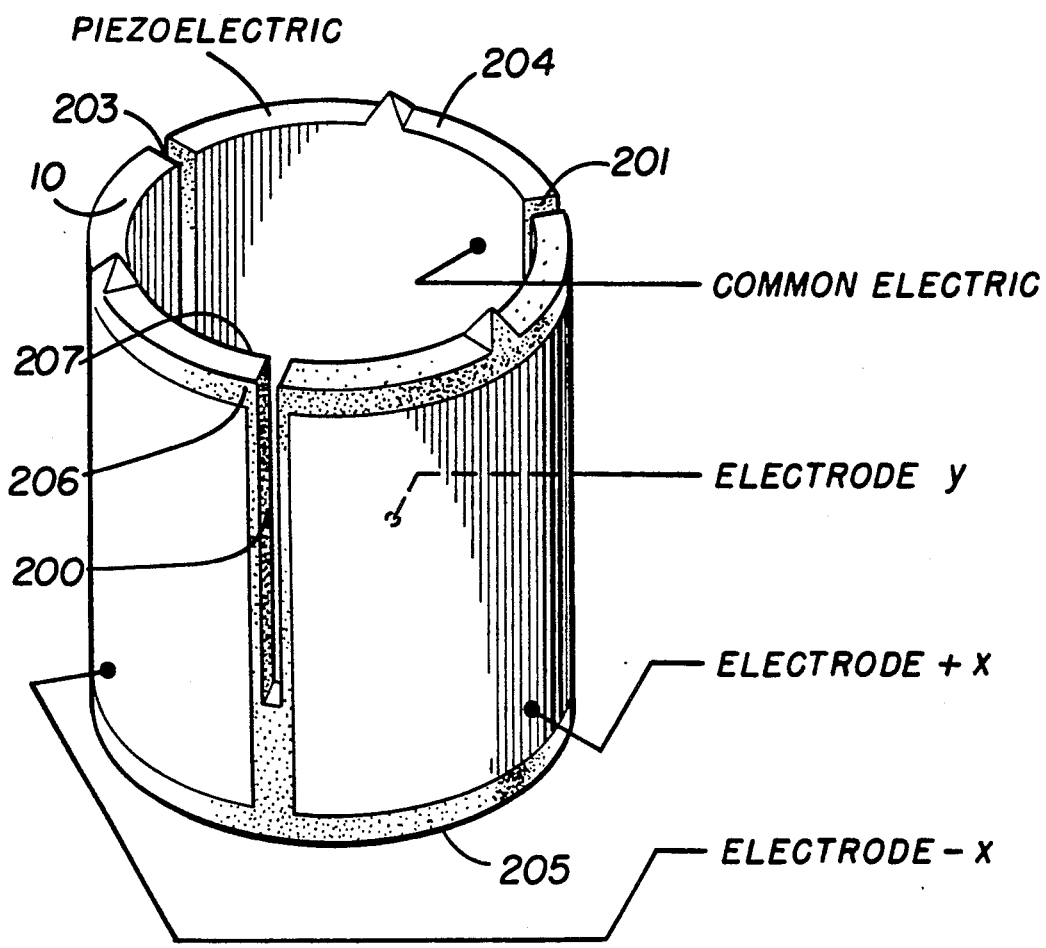
FIG. 6 is a perspective view of an alternative embodiment of the actuator of FIG. 1 according to the present invention having slots between electrodes.

A detailed description of preferred embodiments of the present invention is provided with reference to FIGS. 1 through 8.

FIG. 1 is a perspective view of a preferred embodiment of the actuator according to the present invention. The actuator is formed by a tube 10 of piezoelectric material, such as Lead Zirconate Titinate (PZT). Such tubes are commercially available from Channel Industries, Santa Barbara, Calif., or Piezo Electric Products, Metuchen, N.J.

The tube is approximately 12 mm in diameter. The tube has an outside surface 11 and an inside surface 12 and is approximately 1 mm thick. A first raised object contact 13, a second raised object contact 14, and a third raised object contact 15 are formed on a first end 16 of the tubular member 10. The second end 17 of the tubular member is adapted to be secured to a mounting frame as illustrated in FIG. 7 and may also have defined base contacts (e.g. 44, 45).

The base contacts 44, 45 on the second end 17 of the actuator and a third raised base contact not shown in FIG. 1 are aligned with respective object contacts 13, 14 and 15 on the first end 16 of the actuator. The contact pairs, including a raised object contact on the first end 16 and a raised base contact on the second end 17, each define a line parallel to the axis of the tubular member.

The object contacts 13, 14, 15 are formed by machining the first end to form pointed or spherical domes 13, 14, 15 raised above a surface 16 defining the first end. The contacts 13, 14, 15 may be otherwise secured to the surface 16 as known in the art. The contacts 13, 14, 15 define an object plane for the actuator. Contacts 44, 45 on the second end 17 are formed similarly.

Electrodes 18 (on the backside of the perspective view FIG. 1), 19 and 20 are formed on the outside surface 11 of the tubular member 10. Electrode 18 covers an arc of less than ⅓ of the outside surface 11 of the tubular member 10, the electrode 19 covers an arc of less than ⅓ of the outside surface 11 of the tubular member 10, and the electrode 20 covers an arc of less than ⅓ of the outside surface 11 of the tubular member 10. Electrode 18 is symmetrical about the line defined by object contact 13 and its corresponding base contact on the second end, electrode 19 is symmetrical about the line defined by object contact 14 and base contact 44, and electrode 20 is symmetrical about the line defined by object contact 15 and base contact 45. A common or ground electrode 21 is formed over the majority of the inside surface 12 of the tubular member 10. These electrodes in combination are adapted to establish an electric field inside the piezoelectric tubular member 10 by which the positions of the defined object contacts 13, 14 and 15 are controlled. Obviously, the arrangement of electrodes could be reversed on the inner and outer surfaces or three electrodes could be placed on each surface if it better suited the design of the electrical driver.

A voltage is supplied to electrode 18 across line 22, designated electrode Y. A voltage is supplied to electrode 19 across line 23, designated electrode −X. A voltage is supplied to electrode 20 across line 24, designated electrode +X. The axes of alignment are shown analytically in FIG. 1A, where the object plane is tilted with respect to the X and Y axes by translation of the Y, +X and −X contacts in the Z direction perpendicular to the X-Y plane.

FIG. 2 is a schematic diagram used for illustrating the object plane defined by the first, second and third object contacts 13, 14, 15 on the actuator 10 and an object 50 which is characterized by an alignment plane 51. As mentioned above, the first, second and third object contacts 13, 14, 15 define an object plane 52. The object 50 is secured against the contacts 13, 14, 15 so that the alignment plane 51 has a positively determined relationship with the object plane 52. As the object plane is adjusted by operation of the actuator 10, the alignment plane undergoes a corresponding tilting or translation.

The object 50 in a preferred system may be an output coupler for a laser, such as a partially reflecting mirror. The mirror has a curved reflecting surface 53 which for a given laser related system will require a predetermined relationship with an optical path 54. The alignment plane for a particular embodiment might be selected as perpendicular to the optical path 54. Since the tubular member 10 has a passage extending through the center, the output transmitted through the output coupler proceeds through the passage unobstructed. In this system, the object plane defined by the object contacts 13, 14, 15 is essentially perpendicular to the optical path 54. Obviously, the shape of the tubular member could be adapted to tilt the object plane with respect to the passage through the tubular member as required.

FIG. 3 illustrates an embodiment in which the object plane 70 is tilted at a Brewster angle with respect to the optical path 71. The object 72 includes an alignment plane 73 which must be held at the Brewster angle with the optical path 71. The wide variety of optical devices, such as polarizer plates, have this requirement. In this embodiment, the first end 74 of the tubular member 10 will be cut to define the object plane 70 with the preferred angle with respect to the passage along which the optical path 71 proceeds through the center of the tubular member.

FIG. 4 is a top view of the actuator of FIG. 1. As can be seen, an internal electrode 100 is coupled across line 101 to a common or ground reference voltage. External electrodes 102, 103, and 104 are coupled to the respective electrode inputs. Object contacts 105, 106, 107 defining an equilateral triangle are placed substantially at the center of the electrodes 102, 103, 104 respectively.

The voltages applied to the electrodes control the alignment plane defined by the three contacts 105, 106, 107 which can analytically be represented by FIG. 4A with the axis of translation corresponding to a Z-axis perpendicular to the X and Y axes. In this embodiment, the contacts define an equilateral triangle. The equilateral triangle arrangement of the contacts is preferable so that a symmetrical mounting force can be applied to the object being aligned.

Gap 110 between electrodes 103 and 104, gap 111 between electrodes 104 and 102, and gap 112 between electrodes 102 and 103, are formed to provide for electrical isolation of the control for each of the respective points. The gap in the preferred system is approximately 2 mm for tubular member which is 12 mm in outside diameter and 12 mm in length from the first end 16 to the second end 17. The gap is large enough to withstand the voltage required and may be reduced by insulating materials.

FIG. 5 illustrates an alternative configuration for the object contacts and electrodes according to the present invention. In this embodiment, the three points 120, 121, 122 define a right triangle. A first electrode 123, second electrode 124, third electrode 125, and a fourth electrode 126 are formed on the outside surface 127 of the tubular member 10. Each of the electrode covers an arc of less than ¼ of the outside circumference of the tubular member 10 and is separated by a gap (i.e., 128) to provide electrical isolation. The object contacts are centered on electrode 123, electrode 124, and electrode 125. There is no contact point over electrode 126.

The fourth electrode 126 which is not centered on a contact point may be unnecessary for some embodiments.

FIG. 5A illustrates an analytical relationship of the X, Y, and $X_0Y_0$ contact, where the object plane is tilted with respect to the X-Y plane, by translation of the contacts in the Z direction perpendicular to the X-Y plane.

FIG. 6 illustrates another embodiment of a single tubular member actuator according to the present invention. According to this embodiment, the tubular member 10 is formed with isolation slots 200, 201, and 203 in the gaps between the electrodes. These isolation slots 200, 201, 203, operate to reduce coupling of the expansion and contraction according to a one electrode through the structure of the tubular member 10 to motion of an adjoining contact. These isolation slots 200, 201, 203, may be necessary for a given piezoelectric material that is very rigid. It is found, however, that using PZT in the geometries shown, the isolation slots do not provide substantial improvement in performance of the device. These isolation slots extend from the first end 204 toward the second end 205 of the tubular member 10. They need not extend all the way to the second end 205 as illustrated in FIG. 5. The slots 200, 201, 203 are cut all the way through from the outside surface 206 to the inside surface 207 of the tubular member 10.

FIG. 7 is a schematic cross-sectional diagram of a mounting frame for the actuator according to the present invention.

The mounting frame is supported on a laser system mounting plate 300. A tubular actuator sheath 301 is connected to the mounting plate 300. The sheath 301 includes a circular passage through which a laser beam may pass. The sheath 301 includes a first portion 302 having an inside diameter which is greater than the outside diameter of the actuator 304. In addition, the sheath 301 includes a second portion 303 which has an inside diameter which is less than the outside diameter of the actuator 304. A mounting surface 305 is defined between the first portion 302 and the second portion 303 on which the second end of the actuator rests. In the embodiment shown in FIG. 7, the second end of the actuator includes raised base contacts (e.g. 306) which rest on the surface 305.

The first end 307 of the actuator 304 includes raised object contacts which contact the surface 308 of an output coupler 309.

The output coupler 309 is secured in a spring mounted sheath 310. A spring 311 couples with a bayonet mount 312 which is adapted to be secured into the mounting plate 300.

In the preferred embodiment, the bayonet mount 312 is secured to a beam splitter 313 which splits the output beam of the laser supplying a small portion to a detector, such as a Quad Cell, for detecting the transverse position of the laser beam. The output of a Quad Cell 314 is coupled across line 315 to an actuator controller. The actuator controller generates the voltages required to establish electric fields inside the actuator 304 to control the positioning of the output coupler 309.

The electrical connections to the electrodes are made using threaded contact vias 316 in the mounting sheath 301. A plastic plug 317 with a connector 318 having a dome tip secured in the plug 317, is placed in the contact via 316. One such via 316 is supplied for each of the three electrodes in the three electrode embodiment of FIG. 1. A ground contact is provided by placing a wind of a wire spring 319 which rests against the inside diameter of the actuator 304. On an end of the spring 319, the wire is bent to form a contact with the surface 305 of the mounting sheath 301.

Figure 8:
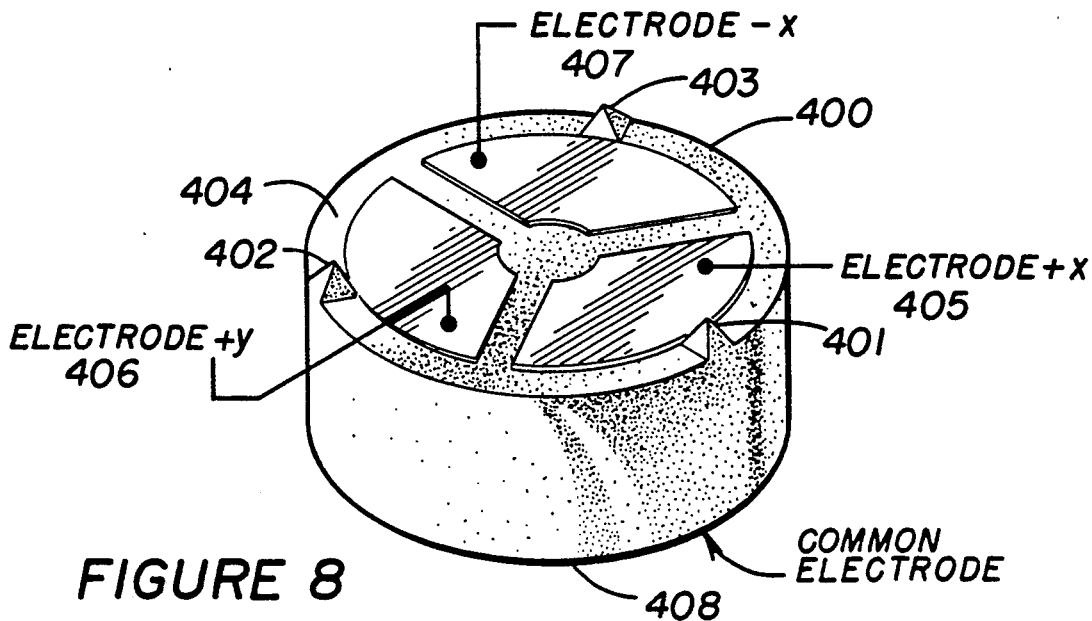
FIG. 8 is a perspective view of an alternative embodiment of an actuator according to the present invention.

FIG. 8 is a perspective view of an alternative embodiment of the single piece actuator according to the present invention. In the embodiment of FIG. 8, the actuator is a solid cylindrical piece 400 of piezoelectric material, such as PZT. Raised object contacts 401, 402 and 403 are formed on a first end 404 of the cylindrical piece 400. Electrodes 405, 406 and 407 are formed on the first end 404 of the actuator 400. Each electrode is symmetrical about an axis defined by the corresponding contact. The ground electrode is formed on the second end 408 of the actuator 400. Raised contacts may be formed on the second end 408 to more precisely define the axes of deflection of the actuator 400, if desired.

Using the actuator according to the present invention, tilting of an object plane can be accomplished with resolution in the range of fractions of a microradian and translation of the object plane controlled in the 1/1000 of a micron region. The total range of each point is approximately 4 microns. The actuator can be inserted in a control loop which detects misalignment of the object coupled to the object plane of the actuator and generates the control voltages applied to the electrodes as is known in the art.

Furthermore, the actuator is simple to manufacture and inexpensive. Because there is only one active part involved, the actuator is suitable for use in very clean environments, such as those requiring very high vacuum, or optical cleanliness.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. An apparatus for controlling alignment of an object, the object characterized by an alignment plane, comprising:

a mounting frame;
a one-piece alignment member, having a first end, a second end, and formed of piezoelectric material;
the one-piece alignment member including a first object contact, a second object contact and a third object contact integrally formed on the first end of the alignment member, and defining an object plane;
the second end of the alignment member secured to the mounting frame;
means for holding the object in contact with the first object contact, second object contact and third object contact, so that the alignment plane has a determined relationship with the object plane; and
means, coupled to the alignment member, for controlling the positions of the first object contact, second object contact and third object contact by establishing an electric field inside the alignment member,
wherein the alignment member has a first base contact, a second base contact and a third base contact on the second end and contacting the mounting frame.

2. An apparatus for controlling alignment of an object, the object characterized by an alignment plane, comprising:
   a mounting frame;
   a one-piece alignment member, having a first end, a second end, and formed of piezoelectric material;
   a first object contact, a second object contact and a third object contact on the first end of the alignment member, and defining an object plane;
   the second end of the alignment member secured to the mounting frame;
   means for holding the object in contact with the first object contact, second object contact and third object contact, so that the alignment plane has a determined relationship with the object plane; and
   means, coupled to the alignment member, for controlling the positions of the first object contact, second object contact and third object contact by establishing an electric field inside the alignment member,
   wherein the alignment member is a hollow circular cylinder having an inside surface and an outside surface, the outside surface defining a circumference of the alignment member, and wherein the means for controlling includes a first electrode formed on the outside surface of the alignment member, a second electrode formed on the outside surface of the alignment member, and a third electrode formed on the outside surface of the alignment member, and wherein
   the first electrode extends from near the first end to near the second end of the alignment member, covers a first arc of less than one third of the circumference of the alignment member, and the center of the first arc is aligned with the first object contact,
   the second electrode extends from near the first end to near the second end of the alignment member, covers a second arc of less than one third of the circumference of the alignment member, and the center of the second arc is aligned with the second object contact, and
   the third electrode extends from near the first end to near the second end of the alignment member, covers a third arc of less than one third of the circumference of the alignment member, and the center of the third arc is aligned with the third object contact; and
   wherein the alignment member has a first slot extending toward the second end from the first end between the first and second electrodes, a second slot extending toward the second end from the first end between the second and third electrodes, and a third slot extending toward the second end from the first end between the third and first electrodes.

3. The apparatus of claim 2, wherein
   the first electrode covers a first arc of less than one fourth of the circumference of the alignment member, and the center of the first arc is aligned with the first object contact,
   the second electrode covers a second arc of less than one fourth of the circumference of the alignment member, and
   the third electrode covers a third arc of less than one fourth of the circumference of the alignment member.

4. An apparatus for controlling alignment of an object, the object characterized by an alignment plane, comprising:
   a mounting frame;
   a one-piece alignment member, having a first end, a second end, and formed of piezoelectric material;
   the one-piece alignment member including a first object contact, a second object contact and a third object contact integrally formed on the first end of the alignment member, and defining an object plane;
   the second end of the alignment member secured to the mounting frame;
   means for holding the object in contact with the first object contact, second object contact and third object contact, so that the alignment plane has a determined relationship with the object plane; and
   means, coupled to the alignment member, for controlling the positions of the first object contact, second object contact and third object contact by establishing an electric field inside the alignment member,
   wherein the alignment member is a hollow circular cylinder having an inside surface and an outside surface, the outside surface defining a circumference of the alignment member, and wherein the means for controlling includes a first electrode formed on the outside surface of the alignment member, a second electrode formed on the outside surface of the alignment member, and a third electrode formed on the outside surface of the alignment member,
   wherein the first electrode extends from near the first end to near the second end of the alignment member, covers a first arc of less than one fourth of the circumference of the alignment member, and the center of the first arc is aligned with the first object contact;
   the second electrode extends from near the first end to near the second end of the alignment member, covers a second arc of less than one fourth of the circumference of the alignment member, and the center of the second arc is aligned with the second object contact; and
   the third electrode extends from near the first end to near the second end of the alignment member, covers a third arc of less than one fourth of the circumference of the alignment member, and the center of the third arc is aligned with the third object contact,
   wherein the means for controlling further includes a fourth electrode formed on the outside surface of the alignment member, and
   the fourth electrode extends from near the first end to near the second end of the alignment member, and covers a fourth arc of less than one fourth of the circumference of the alignment member;
   and wherein the alignment member has a first slot extending toward the second end from the first end between the first and second electrodes, a second slot extending toward the second end from the first end between the second and third electrodes, a third slot extending toward the second end from the first end between the third and fourth electrodes, and a fourth slot extending toward the second end from the first end between the fourth and first electrodes.

5. An apparatus for controlling alignment of an object, the object characterized by an alignment plane, comprising:
   a mounting frame;
   a one-piece alignment member, having a first end, a second end, and formed of piezoelectric material;
   a first object contact, a second object contact and a third object contact on the first end of the alignment member, and defining an object plane;
   the second end of the alignment member secured to the mounting frame;
   means for holding the object in contact with the first object contact, second object contact and third object contact, so that the alignment plane has a determined relationship with the object plane; and
   means, coupled to the alignment member, for controlling the positions of the first object contact, second object contact and third object contact by establishing an electric field inside the alignment member;
   wherein the object transmits a component of a laser beam,
   wherein the alignment member has a passage for transmission of the component,
   wherein the alignment member has a longitudinal axis, and
   wherein the object has a Brewster angle relative to the leaser beam and the object plane is substantially at the Brewster angle with respect to the longitudinal axis.

6. An apparatus for controlling alignment of an object, the object characterized by an alignment plane, comprising:
   a mounting frame;
   an alignment member, having a first end, a second end, and formed of piezoelectric material;
   a first object contact, a second object contact and a third object contact on the first end of the alignment member, and defining an object plane;
   a first base contact, and second base contact and a third base contact on the second end and contacting the mounting frame;
   means for holding the object in contact with the first object contact, second object contact and third object contact, so that the alignment plane has a determined relationship with the object plane; and
   means, coupled to the alignment member, for controlling the positions of the first object contact, second object contact and third object contact by establishing an electric field inside the alignment member.

7. The apparatus of claim 6, wherein the first object contact and first base contact define a first line the second object contact and second base contact define a second line, and the third object contact and third base contact define a third line, and wherein the first line, second line, and third line are essentially parallel.

8. The apparatus of claim 6, wherein the alignment member is cylindrical.

9. The apparatus of claim 6, wherein the alignment member is a hollow circular cylinder.

10. The apparatus of claim 6, wherein the first object contact, second object contact, and third object contact define an equilateral triangle.

11. The apparatus of claim 6, wherein the first object contact, second object contact, and third object contact define a right triangle.

12. The apparatus of claim 6, wherein the alignment member is a hollow circular cylinder having an inside surface and an outside surface, the outside surface defining a circumference of the alignment member, and wherein the means for controlling includes a first electrode formed on the outside surface of the alignment member, a second electrode formed on the outside surface of the alignment member, and a third electrode formed on the outside surface of the alignment member, and wherein
   the first electrode extends from near the first end to near the second end of the alignment member, covers a first arc of less than one third of the circumference of the alignment member, and the center of the first arc is aligned with the first object contact,
   the second electrode extends from near the first end to near the second end of the alignment member, covers a second arc of less than one third of the circumference of the alignment member, and the center of the second arc is aligned with the second object contact, and
   the third electrode extends from near the first end to near the second end of the alignment member, covers a third arc of less than one third of the circumference of the alignment member, and the center of the third arc is aligned with the third object contact.

13. The apparatus of claim 12, wherein the first object contact, second object contact, and third object contact define an equilateral triangle.

14. An apparatus for controlling alignment of an object, the object characterized by an alignment plane, comprising:
   a mounting frame;
   an alignment member, having a first end, a second end, and formed of piezoelectric material;
   a first object contact, a second object contact and a third object contact on the first end of the alignment member, and defining an object plane;
   a first base contact, and second base contact and a third base contact on the second end and contacting the mounting frame;
   means for holding the object in contact with the first object contact, second object contact and third object contact, so that the alignment plane has a determined relationship with the object plane; and
   means, coupled to the alignment member, for controlling the positions of the first object contact, second object contact and third object contact by establishing an electric field inside the alignment member,
   wherein the alignment member is a hollow circular cylinder having an inside surface and an outside surface, the outside surface defining a circumference of the alignment member, and wherein the means for controlling includes a first electrode formed on the outside surface of the alignment member, a second electrode formed on the outside surface of the alignment member, and a third electrode formed on the outside surface of the alignment member,
   wherein the first electrode extends from near the first end to near the second end of the alignment member, covers a first arc of less than one third of the circumference of the alignment member, and the center of the first arc is aligned with the first object contact, the second electrode extends from near the first end to near the second end of the alignment member, covers a second arc of less than one third of the circumference of the alignment member, and the center of the second arc is aligned with the second object contact, and the third electrode extends from near the first end to near the second end of the alignment member, covers a third arc of less than one third of the circumference of the alignment member, and the center of the third arc is aligned with the third object contact, and wherein the alignment member has a first slot extending toward the second end from the first end between the first and second electrodes, a second slot extending toward the second end from the first end between the second and third electrodes, and a third slot extending toward the second end from the first end between the third and first electrodes.

15. The apparatus of claim 6, wherein the alignment member is a hollow circular cylinder having an inside surface and an outside surface, the outside surface defining a circumference of the alignment member, and wherein the means for controlling includes a first electrode formed on the outside surface of the alignment member, a second electrode formed on the outside surface of the alignment member, and a third electrode formed on the outside surface of the alignment member, and wherein the first electrode extends from near the first end to near the second end of the alignment member, covers a first arc of less than one fourth of the circumference of the alignment member, and the center of the first arc is aligned with the first object contact, the second electrode extends from near the first end to near the second end of the alignment member, covers a second arc of less than one fourth of the circumference of the alignment member, and the center of the second arc is aligned with the second object contact, and the third electrode extends from near the first end to near the second end of the alignment member, covers a third arc of less than one fourth of the circumference of the alignment member, and the center of the third arc is aligned with the third object contact.

16. The apparatus of claim 15, wherein the means for controlling further includes a fourth electrode formed on the outside surface of the alignment member, and the fourth electrode extends from near the first end to near the second end of the alignment member, and covers a fourth arc of less than one fourth of the circumference of the alignment member.

17. The apparatus of claim 15, wherein the first object contact, second object contact, and third object contact define a right triangle.

18. An apparatus for controlling alignment of an object, the object characterized by an alignment plane, comprising:

a mounting frame;

an alignment member, having a first end, a second end, and formed of piezoelectric material;

a first object contact, a second object contact and a third object contact on the first end of the alignment member, and defining an object plane;

a first base contact, and second base contact and a third base contact on the second end and contacting the mounting frame;

means for holding the object in contact with the first object contact, second object contact and third object contact, so that the alignment plane has a determined relationship with the object plane; and means, coupled to the alignment member, for controlling the positions of the first object contact, second object contact and third object contact by establishing an electric field inside the alignment member, wherein the alignment member is a hollow circular cylinder having an inside surface and an outside surface, the outside surface defining a circumference of the alignment member, and wherein the mean for controlling includes a first electrode formed on the outside surface of the alignment member, a second electrode formed on the outside surface of the alignment member, and a third electrode formed on the outside surface of the alignment member;

wherein the first electrode extends from near the first end to near the second end of the alignment member, covers a first arc of less than one fourth of the circumference of the alignment member, and the center of the first arc is aligned with the first object contact, the second electrode extends from near the first end to near the second end of the alignment member, covers a second arc of less than one fourth of the circumference of the alignment member, and the center of the second arc is aligned with the second object contact, and the third electrode extends from near the first end to near the second end of the alignment member, covers a third arc of less than one fourth of the circumference of the alignment member, and the center of the third arc is aligned with the third object contact;

wherein the means for controlling further includes a fourth electrode formed on the outside surface of the alignment member, and the fourth electrode extends from near the first end to near the second end of the alignment member, and covers a fourth arc of less than one fourth of the circumference of the alignment member;

and wherein the alignment member has a first slot extending toward the second end from the first end between the first and second electrodes, a second slot extending toward the second end from the first end between the second and third electrodes, a third slot extending toward the second end from the first end between the third and fourth electrodes, and a fourth slot extending toward the second end from the first end between the fourth and first electrodes.

19. The apparatus of claim 6, wherein the alignment member has a longitudinal axis, and wherein the object plane is substantially perpendicular to the longitudinal axis.

20. The apparatus of claim 6, wherein the alignment member has a longitudinal axis, and wherein the object comprises an optical surface having a Brewster angle relative to a laser beam propogating parallel to the longitudinal axis, and the object plane is substantially at the Brewster angle with respect to the longitudinal axis.

21. The apparatus of claim 6, wherein the object comprises an output coupler for a laser cavity and transmits a component of a laser beam, and wherein
the alignment member has a passage for transmission of the component.

22. The apparatus of claim 6, wherein the object comprises a mirror.

23. The apparatus of claim 6, wherein the object transmits a component of a laser beam, and wherein
the alignment member has a passage for transmission of the component.

24. An apparatus for controlling alignment of an object, the object characterized by an alignment plane, comprising:
a mounting frame;
a one-piece alignment member, having a first end, a second end, and formed of piezoelectric material;
a first object contact, a second object contact and a third object contact on the first end of the alignment member, and defining an object plane;
a first base contact, and second base contact and a third base contact on the second end and contacting the mounting frame, wherein the first object contact and first base contact define a first line, the second object contact and second base contact define a second line, and the third object contact and third base contact define a third line, and wherein the first line, second line, and third line are essentially parallel;
means for holding the object in contact with the first object contact, second object contact and third object contact, so that the alignment plane has a determined relationship with the object plane;
a first electrode bonded to the alignment member for creating a first electric field along the first line inside the alignment member;
a second electrode bonded to the alignment member for creating a second electric field along the second line inside the alignment member; and
a third electrode bonded to the alignment member for creating a third electric field along the third line inside the alignment member.

25. The apparatus of claim 24, wherein the alignment member is cylindrical.

26. The apparatus of claim 24, wherein the alignment member is a hollow circular cylinder.

27. The apparatus of claim 24, wherein the first object contact, second object contact, and third object contact define an equilateral triangle.

28. The apparatus of claim 24, wherein the first object contact, second object contact, and third object contact define a right triangle.

29. The apparatus of claim 24, wherein the alignment member is a hollow circular cylinder having an inside surface and an outside surface, the outside surface defining a circumference of the alignment member, and wherein the first electrode is formed on the outside surface of the alignment member, the second electrode is formed on the outside surface of the alignment member, and the third electrode is formed on the outside surface of the alignment member, and wherein
the first electrode extends from near the first end to near the second end of the alignment member, covers a first arc of less than one third of the circumference of the alignment member, and the center of the first arc is aligned with the first object contact,
the second electrode extends from near the first end to near the second end of the alignment member, covers a second arc of less than one third of the circumference of the alignment member, and the center of the second arc is aligned with the second object contact, and
the third electrode extends from near the first end to near the second end of the alignment member, covers a third arc of less than one third of the circumference of the alignment member, and the center of the third arc is aligned with the third object contact.

30. The apparatus of claim 29, wherein the first object contact, second object contact, and third object contact define an equilateral triangle.

31. An apparatus for controlling alignment of an object, the object characterized by an alignment plane, comprising:
a mounting frame;
a one-piece alignment member, having a first end, a second end, and formed of piezoelectric material;
a first object contact, a second object contact and a third object contact on the first end of the alignment member, and defining an object plane;
a first base contact, and second base contact and a third base contact on the second end and contacting the mounting frame, wherein the first object contact and first base contact define a first line, the second object contact and second base contact define a second line, and the third object contact and third base contact define a third line, and wherein the first line, second line, and third line are essentially parallel;
means for holding the object in contact with the first object contact, second object contact and third object contact, so that the alignment plane has a determined relationship with the object plane;
a first electrode bonded to the alignment member for creating a first electric field along the first line inside the alignment member;
a second electrode bonded to the alignment member for creating a second electric field along the second line inside the alignment member; and
a third electrode bonded to the alignment member for creating a third electric field along the third line inside the alignment member;
wherein the alignment member is a hollow circular cylinder having an inside surface and an outside surface, the outside surface defining a circumference of the alignment member, and wherein the first electrode is formed on the outside surface of the alignment member, the second electrode is formed on the outside surface of the alignment member, and second end, and formed of piezoelectric material;
a first object contact, a second object contact and a third object contact on the first end of the alignment member, and defining an object plane;
a first base contact, and second base contact and a third base contact on the second end and contacting the mounting frame, wherein the first object contact and first base contact define a first line, the second object contact and second base contact define a second line, and the third object contact and third base contact define a third line, and wherein the first line, second line, and third line are essentially parallel;

means for holding the object in contact with the first object contact, second object contact and third object contact, so that the alignment plane has a determined relationship with the object plane;

a first electrode bonded to the alignment member for creating a first electric field along the first line inside the alignment member;

a second electrode bonded to the alignment member for creating a second electric field along the second line inside the alignment member; and a third electrode bonded to the alignment member for creating a third electric field along the third line inside the alignment member;

wherein the alignment member is a hollow circular cylinder having an inside surface and an outside surface, the outside surface defining a circumference of the alignment member;

wherein the first electrode is formed on the outside surface of the alignment member, the second electrode is formed on the outside surface of the alignment member, and the third electrode is formed on the outside surface of the alignment member;

and wherein the first electrode extends from near the first end to near the second end of the alignment member, covers a first arc of less than one fourth of the circumference of the alignment member, and the center of the first arc is aligned with the first object contact, the second electrode extends from near the first end to near the second end of the alignment member, covers a second arc of less than one fourth of the circumference of the alignment member, and the center of the second arc is aligned with the second object contact, and the third electrode extends from near the first end to near the second end of the alignment member, covers a third arc of less than one fourth of the circumference of the alignment member, and the center of the third arc is aligned with the third object contact;

the apparatus further including a fourth electrode formed on the outside surface of the alignment member, the fourth electrode extending from near the first end to near the second end of the alignment member and covering a fourth arc of less than one fourth of the circumference of the alignment member;

wherein the alignment member has a first slot extending toward the second end from the first end between the first and second electrodes, a second slot extending toward the second end from the first end between the second and third electrodes, a third slot extending toward the second end from the first end between the third and fourth electrodes, and a fourth slot extending toward the second end from the first end between the fourth and first electrodes.

32. The apparatus of claim 24, wherein the alignment member is a hollow circular cylinder having an inside surface and an outside surface, the outside surface defining a circumference of the alignment member, and wherein the first electrode is formed on the outside surface of the alignment member, the second electrode is formed on the outside surface of the alignment member, and the third electrode is formed on the outside surface of the alignment member, and wherein the first electrode extends from near the first end to near the second end of the alignment member, covers a first arc of less than one fourth of the circumference of the alignment member, and the center of the first arc is aligned with the first object contact, the second electrode extends from near the first end to near the second end of the alignment member, covers a second arc of less than one fourth of the circumference of the alignment member, and the center of the second arc is aligned with the second object contact, and the third electrode extends from near the first end to near the second end of the alignment member, covers a third arc of less than one fourth of the circumference of the alignment member, and the center of the third arc is aligned with the third object contact.

33. The apparatus of claim 32, further including a fourth electrode formed on the outside surface of the alignment member, and the fourth electrode extends from near the first end to near the second end of the alignment member, and covers a fourth arc of less than one fourth of the circumference of the alignment member.

34. The apparatus of claim 32, wherein the first object contact, second object contact, and third object contact define a right triangle.

35. The apparatus of claim 33, wherein the alignment member has a first slot extending toward the second end from the first end between the first and second electrodes, a second slot extending toward the second end from the first end between the second and third electrodes, a third slot extending toward the second end from the first end between the third and fourth electrodes, and a fourth slot extending toward the second end from the first end between the fourth and first electrodes.

36. The apparatus of claim 24, wherein the alignment member has a longitudinal axis, and wherein the object plane is substantially perpendicular to the longitudinal axis.

37. The apparatus of claim 24, wherein the alignment member has a longitudinal axis, and wherein the object comprises an optical surface having a Brewster angle relative to a laser beam propagating parallel to the longitudinal axis, and the object plane is substantially at the Brewster angle with respect to the longitudinal axis.

38. The apparatus of claim 24, wherein the object comprises an output coupler for a laser cavity and transmits a component of a laser beam, and wherein the alignment member has a passage for transmission of the component.

39. The apparatus of claim 24, wherein the object comprises a mirror.

40. The apparatus of claim 24, wherein the object transmits a component of a laser beam, and wherein the alignment member has a passage for transmission of the component.

41. The apparatus of claim 3, wherein the means for controlling further includes a fourth electrode formed on the outside surface of the alignment member, and the fourth electrode extends from near the first end to near the second end of the alignment member, and covers a fourth arc of less than one fourth of the circumference of the alignment member, the alignment member further having a fourth slot extending toward the second end from the first end between the fourth and first electrodes.

* * * * *